United States Patent [19]

Soclof

[11] Patent Number: 4,506,283

[45] Date of Patent: Mar. 19, 1985

[54] SMALL AREA HIGH VALUE RESISTOR WITH GREATLY REDUCED PARASITIC CAPACITANCE

[75] Inventor: Sidney I. Soclof, San Gabriel, Calif.

[73] Assignee: Rockwell International Corporation, El Segundo, Calif.

[21] Appl. No.: 261,435

[22] Filed: May 8, 1981

[51] Int. Cl.³ .............................................. H01L 27/04
[52] U.S. Cl. ........................................ 357/51; 357/49; 357/55; 357/60
[58] Field of Search .................... 357/49, 50, 55, 60, 357/51

[56] References Cited

U.S. PATENT DOCUMENTS

| | | | |
|---|---|---|---|
| 3,359,462 | 12/1967 | Schuetze et al. | 357/49 |
| 3,813,585 | 5/1974 | Tarui et al. | 357/60 |
| 3,919,060 | 11/1975 | Pogge et al. | 357/49 |
| 4,065,742 | 12/1977 | Kendall | 357/60 |
| 4,210,470 | 7/1980 | Marinace | 357/60 |
| 4,260,435 | 4/1981 | Taylor | 357/49 |
| 4,264,382 | 4/1981 | Anantha | 357/50 |
| 4,314,269 | 2/1982 | Fujiki | 357/51 |
| 4,397,075 | 8/1983 | Fatula, Jr. et al. | 357/60 |

FOREIGN PATENT DOCUMENTS 55-53464  4/1980  Japan ................................. 357/60

OTHER PUBLICATIONS

Poponiak et al., IBM Tech. Discl. Bulletin, vol. 18, No. 1, Jun. 1975, pp. 125–126.
Badami et al., IBM Tech. Discl. Bulletin, vol. 18, No. 1, Jun. 1975, pp. 116–117.

*Primary Examiner*—William D. Larkins

*Attorney, Agent, or Firm*—H. Fredrick Hamann; Wilfred G. Caldwell

[57] ABSTRACT

The invention provides a unique sub-micron dimensioned resistor and methods of making the same, wherein hundreds of such resistors may be fabricated on a single chip with each comprising an active region surrounded by field oxide completely isolating it from the substrate and its effects on operation. Spaced apart slots made in the substrate permit the introduction of orientation dependent etching fluid therein to at least substantially etch semi-arrays of active regions of the substrate away from the substrate except for spaced apart supports therealong. Oxidation serves to support the semi-arrays and subsequent steps directly from the substrate or by webs of oxidation along the tops of the semi-arrays connected to the substrate. The support is necessary while orthogonal slots are provided permitting access to opposed sides of the active regions for doping from each end, which doping is driven in from both sides to provide a resistor active region to which electrical connections are applied using conventional techniques providing almost complete reduction of the parasitic capacitances because of the total oxide isolation of the active regions from the substrate.

The resistors may also be made by forming intersecting slots in spaced apart relation across the substrate to define semi-arrays of V shaped intermediate regions which will become resistors. Silicon oxide fills these slots and separates the resistor regions from the substrate. Orthogonal slots divide the semi-arrays into individual resistor active regions which are optionally doped by one of N or P doping introduced into each active region via the orthogonal slots and driven in to comprise the resistors.

4 Claims, 16 Drawing Figures

SMALL AREA HIGH VALUE RESISTOR WITH GREATLY REDUCED PARASITIC CAPACITANCE

FIELD OF THE INVENTION

This invention is a novel structure and method for forming a sub-micron small area high value dielectrically isolated resistor utilizing VLSI chip processing steps to fabricate hundreds of such elements simultaneously.

BACKGROUND OF THE INVENTION

Techniques extracted from the prior art come from the field of sub-micron fabrication technology wherein the dimensional resolution is now comparable to or even smaller than the thicknesses of the thermally grown silicon oxide layers on silicon. Also, the dimensions are now comparable or even smaller than the base widths used for double diffused transistors, i.e., 0.4 to 1.0 micrometers. From these techniques, the novel structure and method for the small area resistor with greatly reduced parasitic capacitance and greatly enhanced resistance is achieved.

SUMMARY OF THE INVENTION

The invention is a novel resistor formed on a substrate by orthogonal slots which define each active resistor region and permit undercutting of the active regions via a first pair of intersecting opposed slots, followed by oxidation for support of the spaced apart semi-arrays of resistor regions formed by the first pair of intersecting slots. Oxidation fills in the second slots after they have subdivided the semi-arrays of resistors into single elements to totally isolate each resistor.

BRIEF DESCRIPTION OF A PREFERRED EMBODIMENT OF THE INVENTION

In the device produced in accordance with the present invention, the effects of the substrate are minimized relative to the operation of the device. It should be realized that the active region may be completely contained with the surface area of $3d \times 5d$ or $15d^2$ wherein d is only 0.4 micrometers. The isolated region is completely separated from the substrate by oxidation and the parasitic capacitances are almost completely reduced to a minimum value attainable because the resistor is reduced essentially to just its electronically active region, whereas in conventional devices, the electrically active region is only a very small fraction of the total area. The dielectric isolation between resistors offered by the same substrate oxidation has advantages with respect to high frequency performance, high voltage integrated circuits, radiation resistance, and circuit flexibility.

Figure 1:
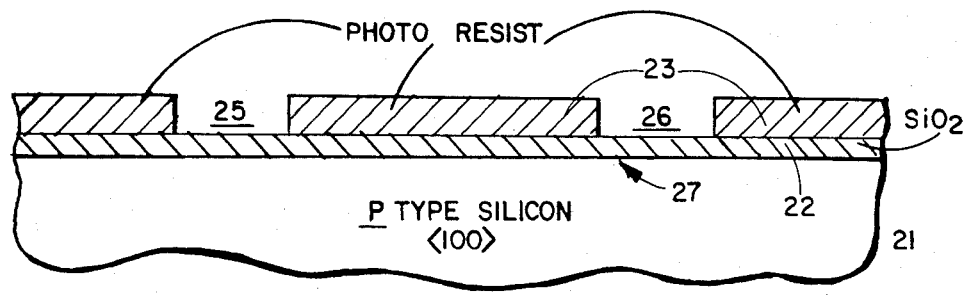
FIG. 1 is a view in section of a P-type substrate having patterned resist thereover for the subsequent step.

Reference now to FIG. 1 shows a silicon substrate 21, e.g., of the P type, patterned by photoresist 23 to leave exposed the regions 25 and 26 which will be subsequently slotted. It should be noted that the upper surface 27 of substrate 21 is a (100) surface useful in orientation dependent etching.

Figure 2:
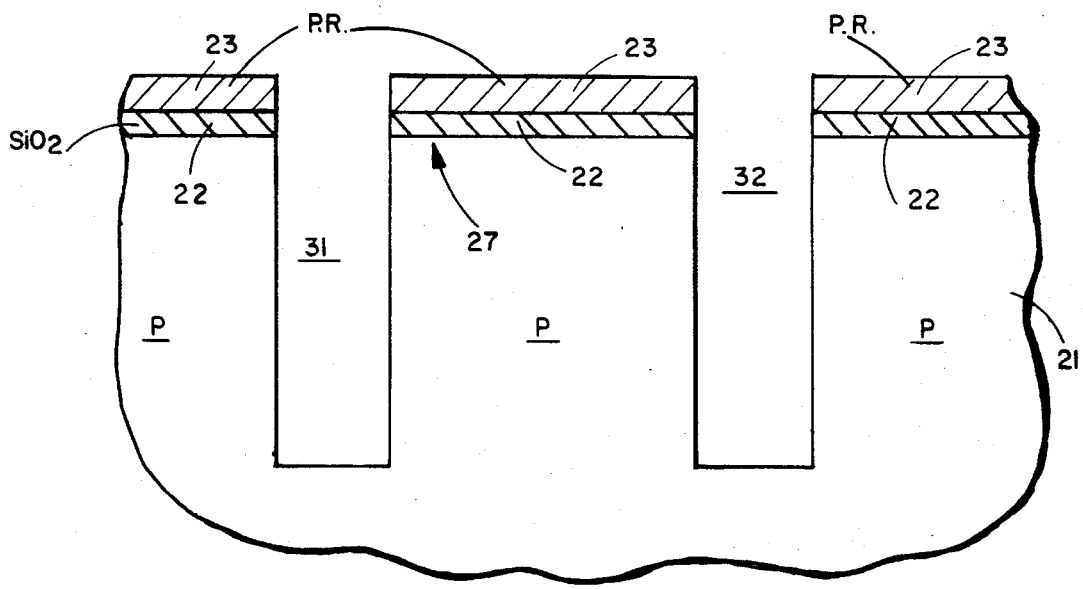
FIG. 2 shows the structure of FIG. 1 after spaced-apart slots have been formed.

In the sectional view of FIG. 2, slots 31 and 32 have been formed into substrate 21 through upper surface 27 in the unprotected regions 25 and 26. Slotting may be achieved by ion milling or etching and thus removes the unprotected portions of the substrate oxide layer 22.

Figure 3:
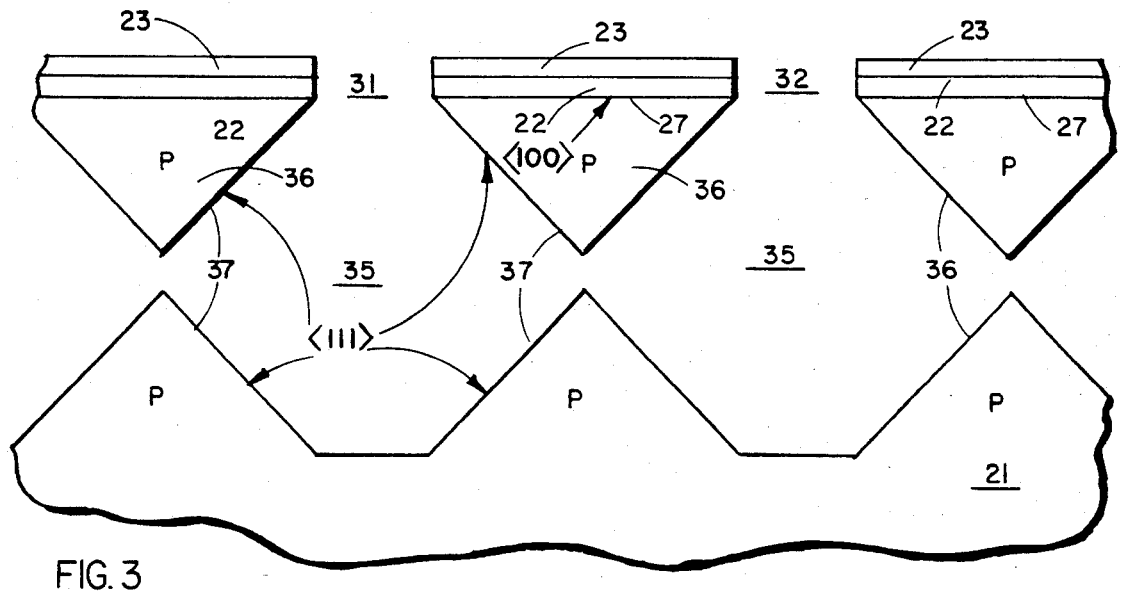
FIG. 3 shows the same structure following the etching step wherein the etching fluid is introduced into the slots previously formed.

In FIG. 3 there is shown the substrate 21 after orientation dependent etching fluid is introduced through slots 31 and 32 to attack the substrate, oxide layer 22 remaining after the resist 23 has been removed protects the upper surface of the triangular semi-arrays 36 from attack by the fluid. The orientation dependent etching fluid removes the regions 35 from the substrate 21, which regions are bounded by planes (111), shown at 37.

It may be seen that the semi-arrays 36 are separated from the substrate 21, however, at spaced apart longitudinal positions along the semi-array regions 36 spaced apart supports of silicon are left to prevent the semi-arrays 36 from collapsing into the voids 35. These spaced apart supports may be protected from oxidation by spaced apart stripes of material immune to the etch placed along the slots 31 and 32. Alternatively, the semi-array regions 36 may need be only supported at their ends which can be accomplished by leaving a boundary or peripheral region of oxide 22 on the surface (100) shown at 27.

Figure 4:
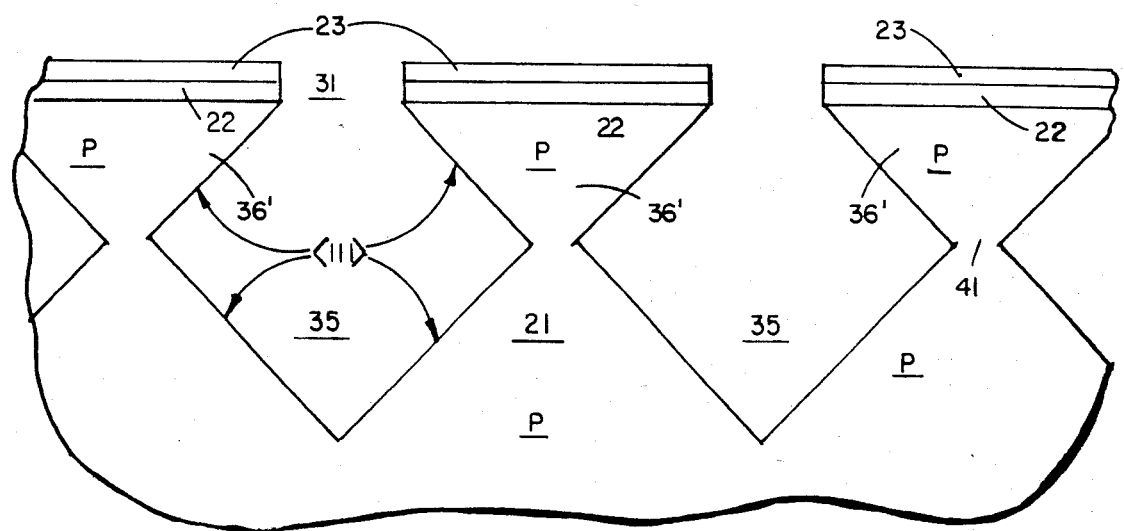
FIG. 4 shows an alternative step to FIG. 3 wherein the etching step is terminated prior to separating the resistor active regions from the substrate.

FIG. 4 shows an alternative step to that described in FIG. 3 wherein the etching is stopped earlier so that the arrays 36' are still supported from the silicon substrate by narrow connections or webs 41.

Following the etching steps of FIG. 3 or 4, the resist 23 is removed in conventional fashion.

Figure 5:
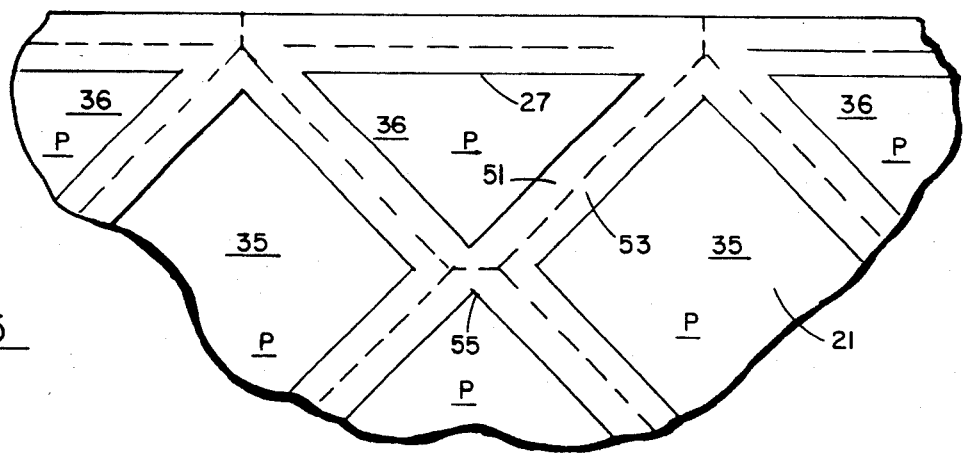
FIG. 5 is a view of the structure of FIG. 4 following oxidation of the substrate.

In FIG. 5, the structure of FIG. 3 is shown following oxidation of the substrate 21. It may be seen that the oxide grows inwardly of the semi-array region 36, as shown at 51, and outwardly thereof, as shown at 53. Thus, the intersection 55 shows a solid oxide support for the region 37 which will enable subsequent steps to be performed.

Figure 6:
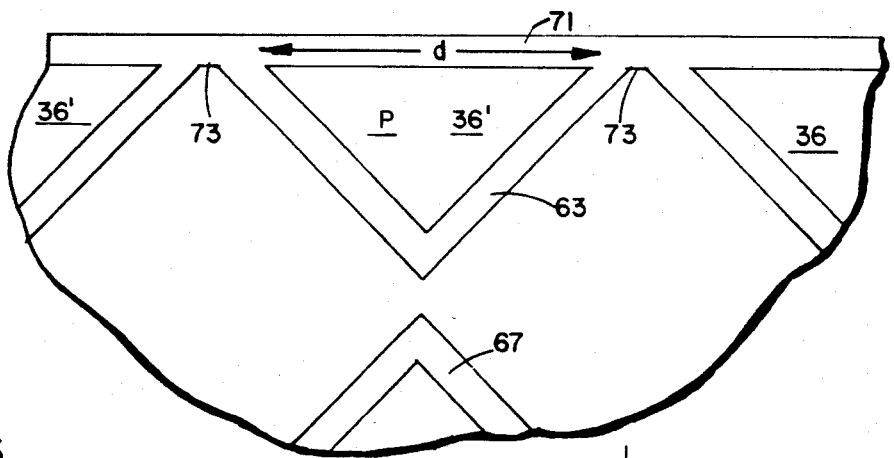
FIG. 6 is a view of the structure of FIG. 3 following oxidation of the substrate.

However, this oxide support is not necessary in view of the FIG. 6 arrangement wherein the oxide coating 63 and 67 do not come together to support region 36', but the upper oxide 71 extends webs 73 between the regions 36' to maintain a top support for all semi-array regions 36'.

Figure 7:
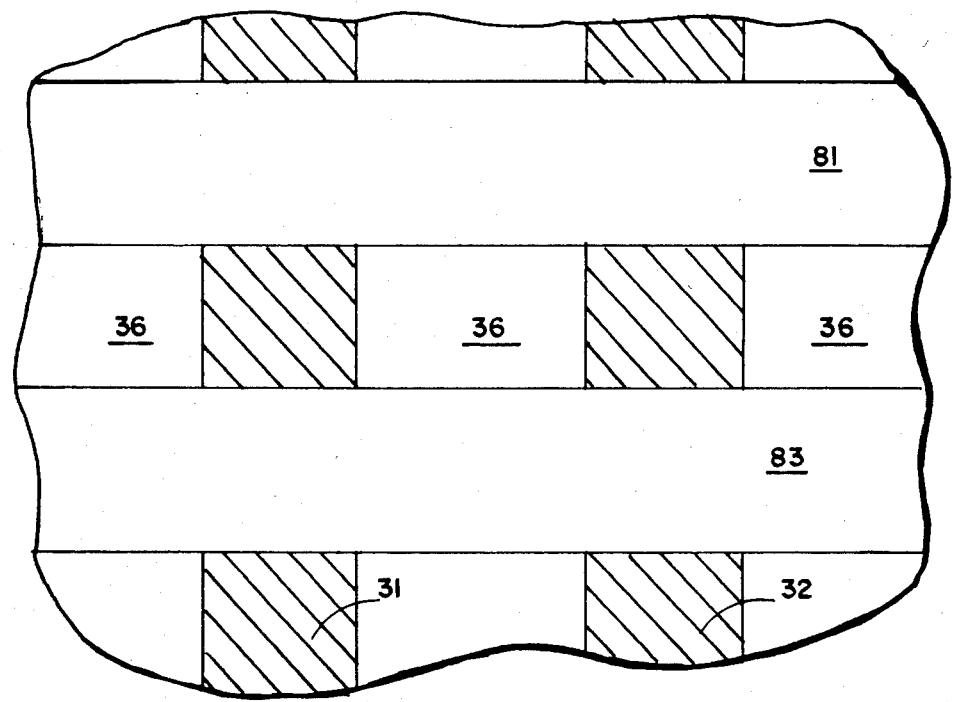
FIG. 7 shows the addition of orthogonally related slots relative to the first slots.

The succeeding step wherein support is required is shown in FIG. 7. Orthogonal slots 81 and 83, together with slots 31 and 32 form a mote around each active region 36. Also, from FIG. 7 it may be seen that slots 31 and 32 are filled with oxide except where slots 81 and 83 cut through the oxide. Obviously, slots 81 and 83 are not filled with oxide and they are next used for any doping step to follow, if desired.

Figure 8:
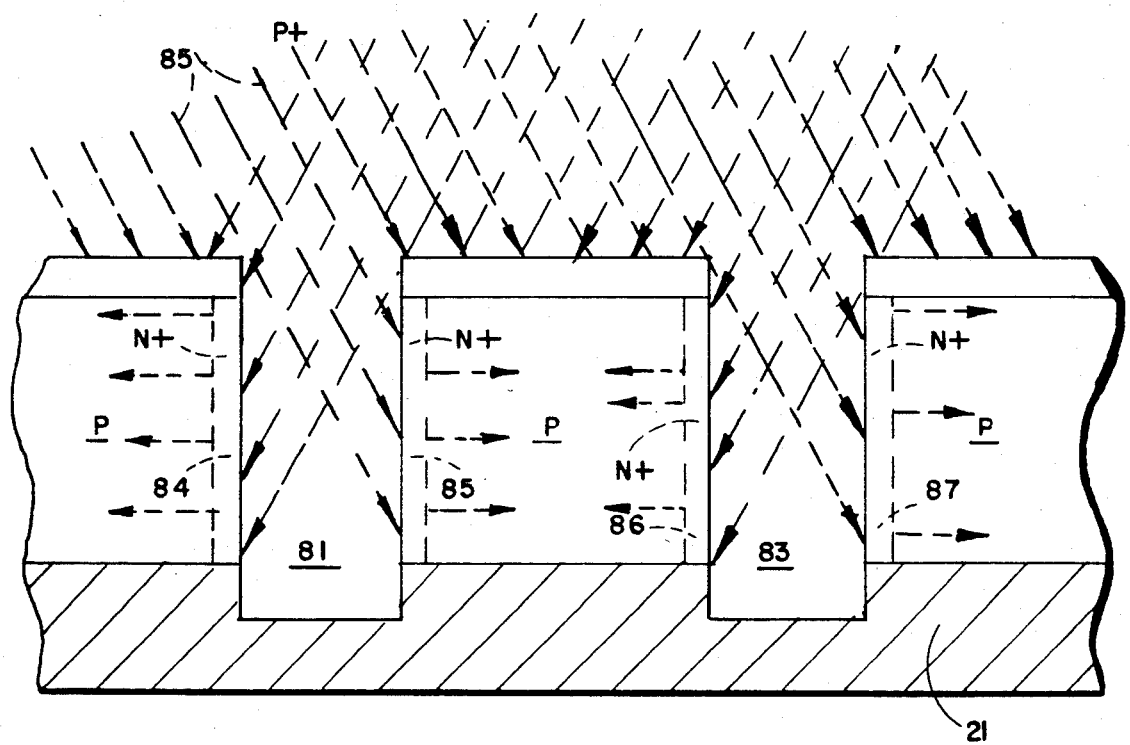
FIG. 8 illustrates doping of the separated active resistor regions.

In FIG. 8 it may be seen that N+ ions (phosphorus) are implanted into the edges of slots 81 and 83 as indicated by the advancing lines 85. This ion implant forms N+ doping driven in, as by heat, to completely fill selected active regions for low value resistors requiring N+ doping.

Figure 9:
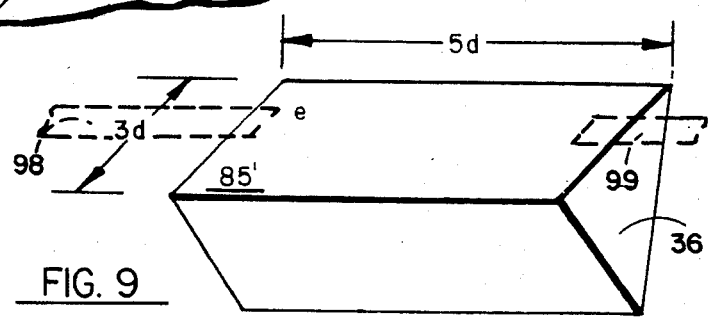
FIG. 9 is a view in perspective of the active region, per se, showing the fully isolated resistor with lead connections.

In FIG. 9 the active region is seen, per se, with a width dimension of 3d and a length dimension of 5d.

Electrical connections 98 and 99 are made to the resistor active region 36 by conventional means of metallization which overlays the region 36 at 98 and 99.

In the device produced in accordance with the preferred embodiment of the present invention, the effects of the substrate are minimized relative to the operation of the device. It should be realized that the isolated active region may be completely contained within a surface area of approximately $5d \times 3d = 15d^2$. The active region is completely separated from the substrate by substrate oxidation and the parasitic capacitances is almost completely reduced to a minimum value attainable because the resistor is reduced to just its electronically active region.

Figure 10:
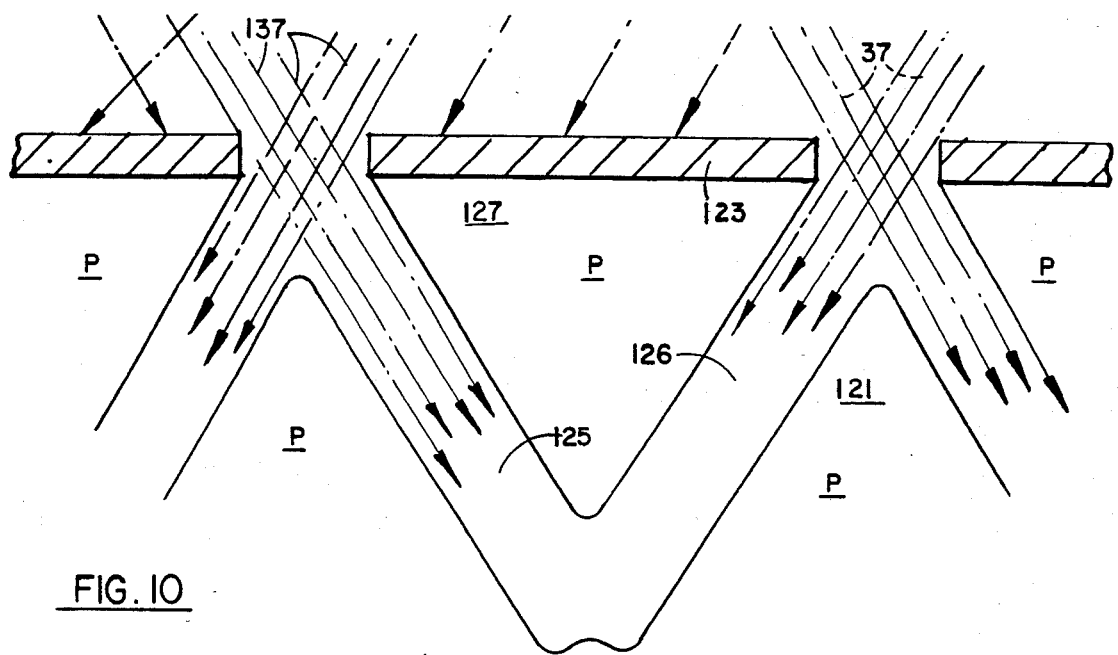
FIG. 10 is a cross sectional view through a substrate showing the formation of intersecting slots for the preferred embodiment.

Referring now to FIG. 10, substrate 121 may be N or P doped and is masked by photoresist 123 which is patterned to define the penetration regions for intercepting slots 125 and 126. Since substrate 121 is shown doped P type, the intermediate region 127 which will eventually comprise a plurality of resistors, is also of the P type, having been carved from the substrate by the slots 125 and 126. To prevent intermediate region 127, better defined as a semi-array of resistor regions, from falling into substrate 121, it should be noted that the slots 125 and 126 are interrupted to leave shoulders at spaced apart intervals therealong, best seen at 131, 132, and 133 in FIG. 13.

Since the preferred way of forming slots 125 and 126 is by ion milling, shown by the flux lines 137 in FIG. 10, the masking layer 123 is a material with a low sputtering rate, such as one of the heavier metals.

Figure 11:
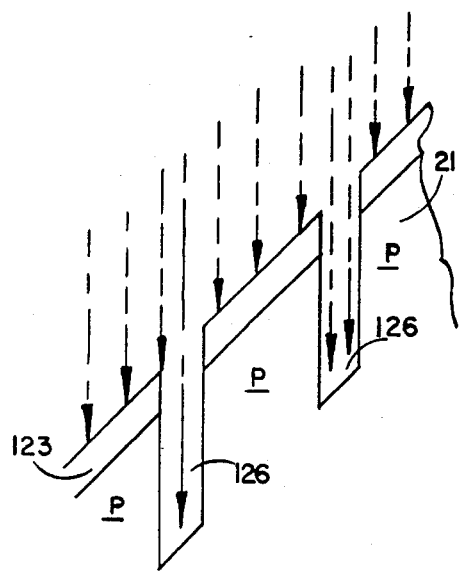
FIG. 11 shows a substrate oriented at an angle above the horizontal such that vertical milling may form the diagonally penetrating slots.
Figure 12:
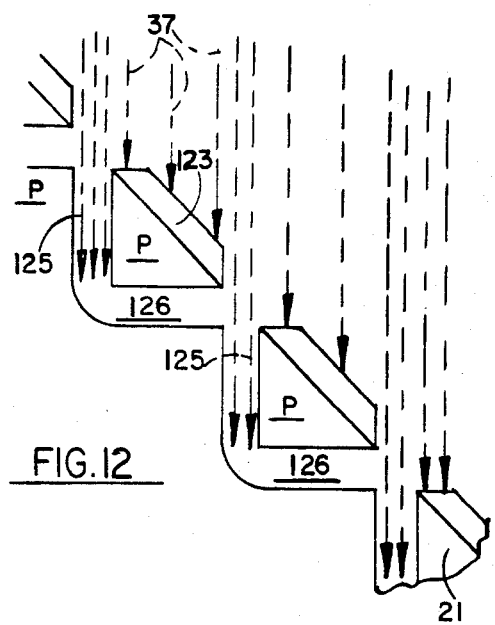
FIG. 12 shows the substrate oppositely oriented to that of FIG. 11 such that vertical milling may again form the other portion of the intersecting slots.

FIGS. 11 and 12 illustrate the ease of forming intercepting (or intersecting) slots such as 125 and 126 simply by orienting the substrate at angles, e.g., 60° to the horizontal, such that the ion flux 137 may remain in its vertical pattern to form first slots 126 and thereafter slots 125 simply by rotating the substrate 121 90°.

While the triangular array 127 is shown as being substantially equilateral, it need not be and the angles may be varied to configure the active regions as desired for specific values. It will also be noticed from FIGS. 11 and 12 that slots 125 and 126 terminate where they intercept because extending them deeper into the substrate would serve no purpose.

Figure 13:
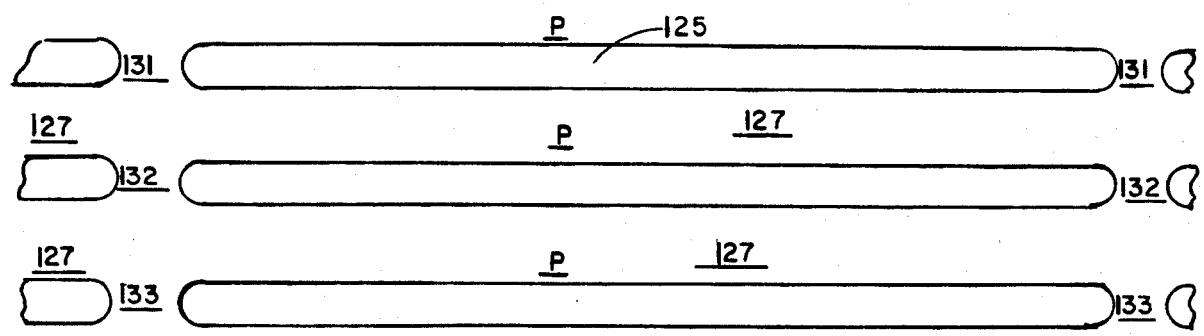
FIG. 13 is a view in top plan of the substrate showing the spaced apart intersecting slots with support regions between the ends thereof.

From FIG. 13 it may be seen that the slots 125 and 126 may be intermittent such that supporting ribs or webs 131, 132 and 131', 132' serve to support each semi-array 127. These webs or supports may be at spaced apart locations along the slots 125 and 126 or merely comprise only supports at the edges of the chips because they serve but a temporary purpose as the slots will be filled with substrate oxide to provide the permanent support for each resistor region.

Figure 14:
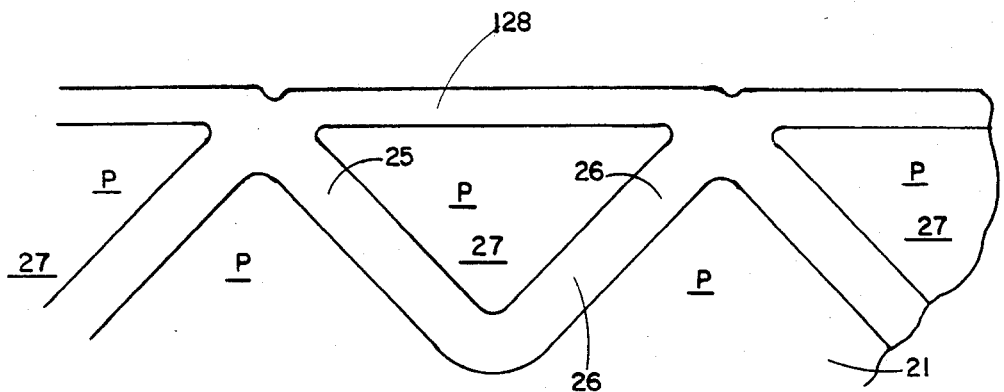
FIG. 14 is a front view of the triangular semi-arrays of substrate formed by the intersecting slots and separated from the substrate proper.

The oxidation step is shown in FIG. 14 wherein silicon oxide 125' and 126' fill the respective slots 125 and 126. Also, an upper layer of silicon oxide 128 covers the upper surface and is contiguous with the silicon oxide 125' and 126' such that semi-array 127' is totally isolated from the substrate 121 by the silicon oxide and the periphery of the semi-arrays 127 are substantially covered by the oxide.

Figure 15:
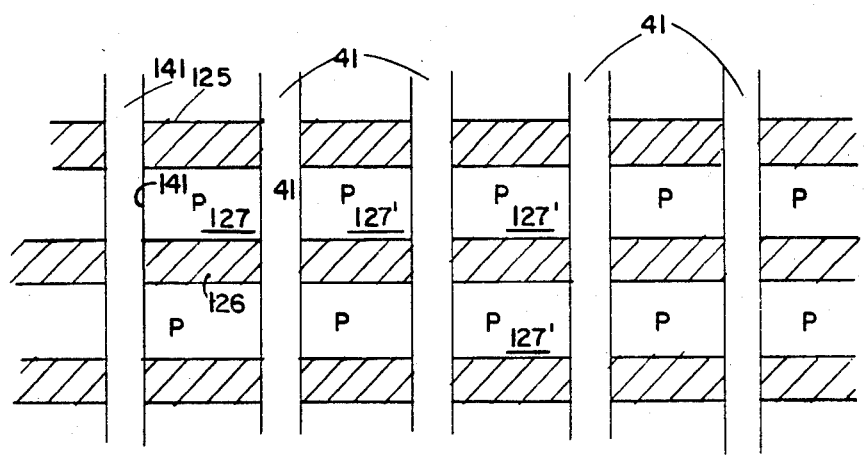
FIG. 15 shows the introduction of orthogonal slots relative to the pairs of intersecting slots.
Figure 16:
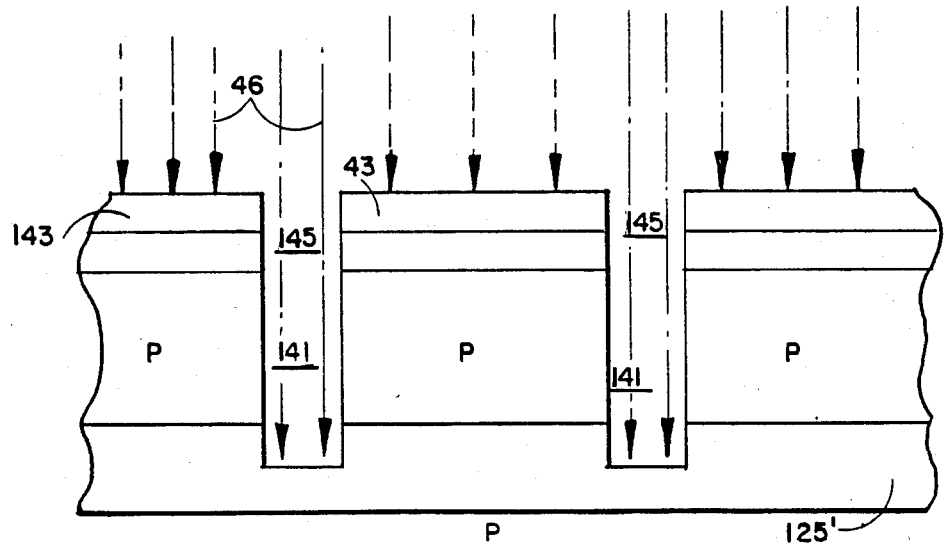
FIG. 16 shows the formation of the orthogonal slots via milling.

In FIG. 15 orthogonal slots 141 divide the semi-arrays 127 into the individual resistor regions 127' and provide ingress for any doping to follow. Thus, each orthogonal slot 141 includes sidewalls 141' through which individual resistor region 127' may be doped. The other sidewalls of slots 141 provide for doping adjacent resistor regions 127'. Slots 141 may be ion milled using the masking technique heretofore employed. Consequently, photoresist 143 of a heavier metal is patterned as shown in FIG. 16 to provide for ion milling slots 141 via the openings 145 in the heavy photoresist 143 and silicon layer. The ion flux is illustrated by the lines 146.

Depending on the bulk doping N or P, the opposite doping may be introduced or heavier doping of the same type may be introduced to obtain different values of resistors. This may be done selectively, such that various values of resistance are available.

Conventional metallization connections may be established for the resistors herein and in composite circuitry dies it is often desirable to use polysilicon or diffused lines which involve only conventional techniques and accordingly are not illustrated herein.

It will be understood that resistors may be merely formed from the doped bulk silicon, but provision for N, N+, P or P+ doping permits variation of the values of resistance obtainable. This is true for the entire chip or die or selectively available thereacross.

For either embodiment, if the width across the resistor top is d (FIG. 6), it will now be shown how these micro-fabrication techniques, along with the dielectric isolation, provide high value, small area resistors exhibiting low parasitic capacitance.

Let $d = 1$ micrometer $A \cong \frac{1}{2}d^2 = 0.5 \times^{-8} cm^2$

Assume $\rho = 1$ ohm-cm.

Then $\frac{R}{L} = \frac{\rho}{A} = \frac{1 \text{ ohm-cm}}{0.5 \times 10^{-8} cm^2} = 2 \times 10^8$ ohm/cm.

$= 2 \times 10^4$ ohm/$\mu$cm. $= 20$ K$\Omega$/$\mu$m

Which exhibits the exceptionally high resistive values for such resistors of very small lengths.

Since $C = \dfrac{\epsilon A}{t_{ox}} \cong \dfrac{\epsilon(3d)L}{t_{ox}}$ and $R = \dfrac{\rho L}{A} = \dfrac{2\rho}{d^2} L$, $T = RC = \dfrac{6\rho\epsilon}{d\, t_{ox}} L^2$ If $d = 1\ \mu m$, $t_{ox} = 0.5\ \mu m$.

$\rho = 1\ \Omega\text{-cm.}$, $\epsilon_{ox} = 3.8$ to then $T \cong 4\ ps/(\mu m)^2$ If $L = 1\ \mu m$, $R = 20K\ \Omega$, $fH \cong \left[\dfrac{1}{2\pi r}\right] = 40\ GHZ$ Which indicates that using such small geometries, together with dielectric insulation, large value integrated chip resistors with large break-point frequencies are available.

While further modifications may occur to those skilled in the art from a reading of the detailed description hereof, it is intended that the invention be defined by the scope of the claims appended wherein:

What is claimed is:

1. An array of sub-micron dimensioned resistors formed in a silicon substrate doped P-type, each comprising in combination:

a plurality of first sidewalls of pairs of intersecting slots in spaced apart relation across the substrate defining semi-arrays of V shaped intermediate regions which will become resistors;

silicon oxide filling said slots and covering the surface of the substrate through which they were made;

a plurality of second sidewalls of orthogonal slots relative to said pairs of slots dividing the semi-arrays of regions into individual resistor active regions;

N+ doping introduced into each of said active regions via said second sidewalls and driven in to change resistive values of said regions from the resistive value of the substrate;

metallization patterns in electrical connection with the doped active regions; and, silicon oxide at least substantially covering the periphery of each active region.

2. An array of sub-micron dimensioned resistors formed on a silicon doped substrate, each comprising in combination:

a plurality of first sidewalls of pairs of intersecting slots in spaced apart relation across the substrate defining semi-arrays of V shaped intermediate regions which will become resistors;

silicon oxide filling said slots and covering the surface of the substrate through which they were made;

a plurality of second sidewalls of orthogonal slots relative to said pairs of slots dividing the semi-arrays of regions into individual resistor active regions;

P+ doping introduced into each of said active regions via said second sidewalls and driven in to comprise doped active regions having different resistive values than the substrate;

metallization patterns in electrical connection with the doped active regions; and, silicon oxide at least substantially covering the periphery of each active region.

3. An array of sub-micron dimensioned lateral resistors formed on a silicon substrate doped P or N type, each comprising in combination:

a plurality of first sidewalls of pairs of intersecting slots in spaced apart relation across the substrate defining semi-arrays of V shaped intermediate regions which will become resistors;

silicon oxide filling said slots and covering the surface of the substrate through which they were made;

a plurality of second sidewalls of orthogonal slots relative to said pairs of slots dividing the semi-arrays of regions into individual resistor active regions;

doping of one of N and P introduced into each of said active regions via said second sidewalls and driven in to comprise changed resistive value regions;

metallization patterns in electrical connection with the regions; and, silicon oxide at least substantially covering the periphery of each active region.

4. An array of sub-micron dimensioned resistors formed in a substrate doped p-type, each comprising in combination:

spaced apart slots in the substrate through which means are introduced at least to substantially undercut the intermediate regions formed by the slots except for spaced apart supports for said intermediate regions;

substrate oxide about the peripheries of said intermediate regions where resistors will be formed;

spaced apart slots orthogonal to said first mentioned slots dividing said intermediate regions into a plurality of active regions respectively for said resistors;

N+ doping in the active regions received via said orthogonal slots;

said N+ doping being present throughout the active regions to change the resistance thereof from that of the substrate;

each said active region being substantially a triangular prism having a length of 5d and a width of 3d wherein d is 0.4 to 1 micrometer; and, metallization connections to each of said active regions.

* * * * *